Jan. 11, 1966 T. D. SMITH 3,229,053

PRINTED CIRCUIT PUSH BUTTON SWITCH DEVICE WITH CAM FOLLOWER CONTACT ACTUATING STRUCTURE

Filed Oct. 15, 1962 4 Sheets-Sheet 1

INVENTOR.
THEODORE D. SMITH
BY Eugene M. Whitacre
ATTORNEY

INVENTOR.
THEODORE D. SMITH
BY
Eugene M. Whitacre
ATTORNEY

Jan. 11, 1966 T. D. SMITH 3,229,053

PRINTED CIRCUIT PUSH BUTTON SWITCH DEVICE WITH CAM FOLLOWER CONTACT ACTUATING STRUCTURE

Filed Oct. 15, 1962 4 Sheets-Sheet 3

INVENTOR.
THEODORE D. SMITH
BY
Eugene M. Whitacre
ATTORNEY

Jan. 11, 1966 T. D. SMITH 3,229,053

PRINTED CIRCUIT PUSH BUTTON SWITCH DEVICE WITH CAM FOLLOWER CONTACT ACTUATING STRUCTURE

Filed Oct. 15, 1962 4 Sheets-Sheet 4

INVENTOR.
THEODORE D. SMITH
BY Eugene M. Whitacre
ATTONEY

United States Patent Office 3,229,053

Patented Jan. 11, 1966

3,229,053

PRINTED CIRCUIT PUSH BUTTON SWITCH DEVICE WITH CAM FOLLOWER CONTACT ACTUATING STRUCTURE

Theodore D. Smith, Indianapolis, Ind., assignor to Radio Corporation of America, a corporation of Delaware Filed Oct. 15, 1962, Ser. No. 230,580
6 Claims. (Cl. 200—16)

This invention relates to push-button operated switching devices. Although the invention relates to push-button operated switches generally, it has particular application where the apparatus with which the switch is used is of relatively small size, such as in a hand held remote control transmitter.

In remote controlling of television receivers, suitable control signal waves are transmitted from the remote position to the receiver. These waves may be produced by a portable sonic transmitter including an oscillator, the output of which is applied to a sonic transducer. The sonic signal waves are received at the receiver and cause control thereof.

The portable transmitter may include several push-buttons. Upon pushing one of these buttons a wave of a predetermined frequency is produced by the control oscillator. When this wave frequency is produced, the receiver responds in a particular predetermined manner, as by turning the volume control shaft of the receiver in one direction. Upon production of second frequency, the receiver responds in another manner, as by turning the volume control shaft in the opposite direction or as by turning the tuning control shaft knob in one direction. Whenever it is desired to cause actuation of a receiver control which is not movable throughout an indefinite number of cycles, such as the tint, the color and the volume control (including the on and off function) of a color television receiver, a pair of signals is provided to cause operation of each of these controls in opposite directions; however, since the tuning control shaft may usually turn beyond 360°, only one control signal, which is different from any of the other signals, is provided to control this function. Therefore, for remote control of the tint, color, volume and the channel of the color television receiver, it is necessary to provide seven different sonic control frequencies.

The oscillator, which is included in the portable control transmitter, may be energized and tuned by selectively connecting one of a plurality of reactances, such as condensers, in its tuning circuit when one of the push buttons is depressed. The switch may be spring-urged to an off position at which the power supply of the oscillator is disconnected. The components of the portable control box including its push-button operated switches should be as light and as small as is consistent with proper operation thereof.

It is an object of this invention to provide an improved push button actuated switch.

Another object of this invention is to provide an improved push button actuated switch.

Another object of this invention is to provide an improved push-button operated switch for a remote control transmitter device for remote control of television receivers.

It is an object of this invention to provide an improved push-button operated switch for a remote transmitter capable of transmitting a plurality of supersonic control waves.

An odd number, seven, for example of push-buttons extend from an external surface of a control box. Each of the push buttons cause motion of a conductive slide across a printed circuit board in a direction perpendicular to the motion of the push button. All but one of the push buttons are arranged in pairs, the two buttons of a pair causing opposite directions of motion of an associated contact. Upon pushing a button, predetermined circuit connections are made which cause a sonic wave of a predetermined frequency to be emitted from the control box for controlling operation of a remotely positioned television receiver. Resilient means bias the push buttons and the contacts toward their original position.

This invention is fully explained in the following detailed description, in which.

Figure 12:
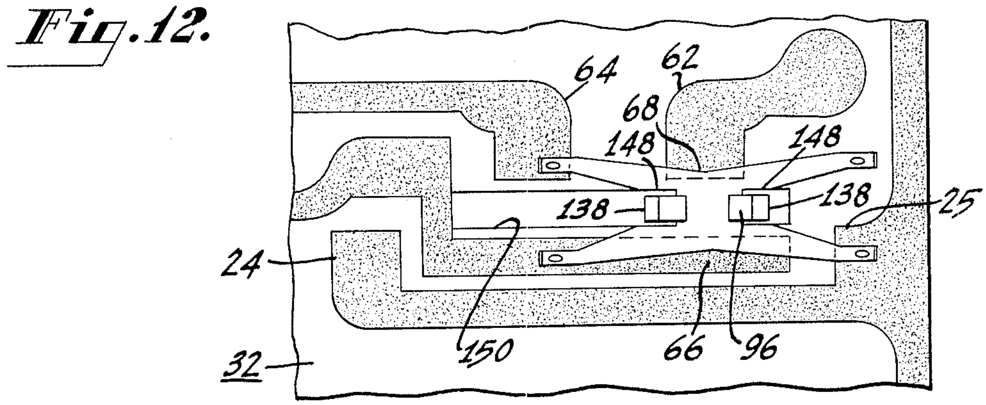
Figure 13:
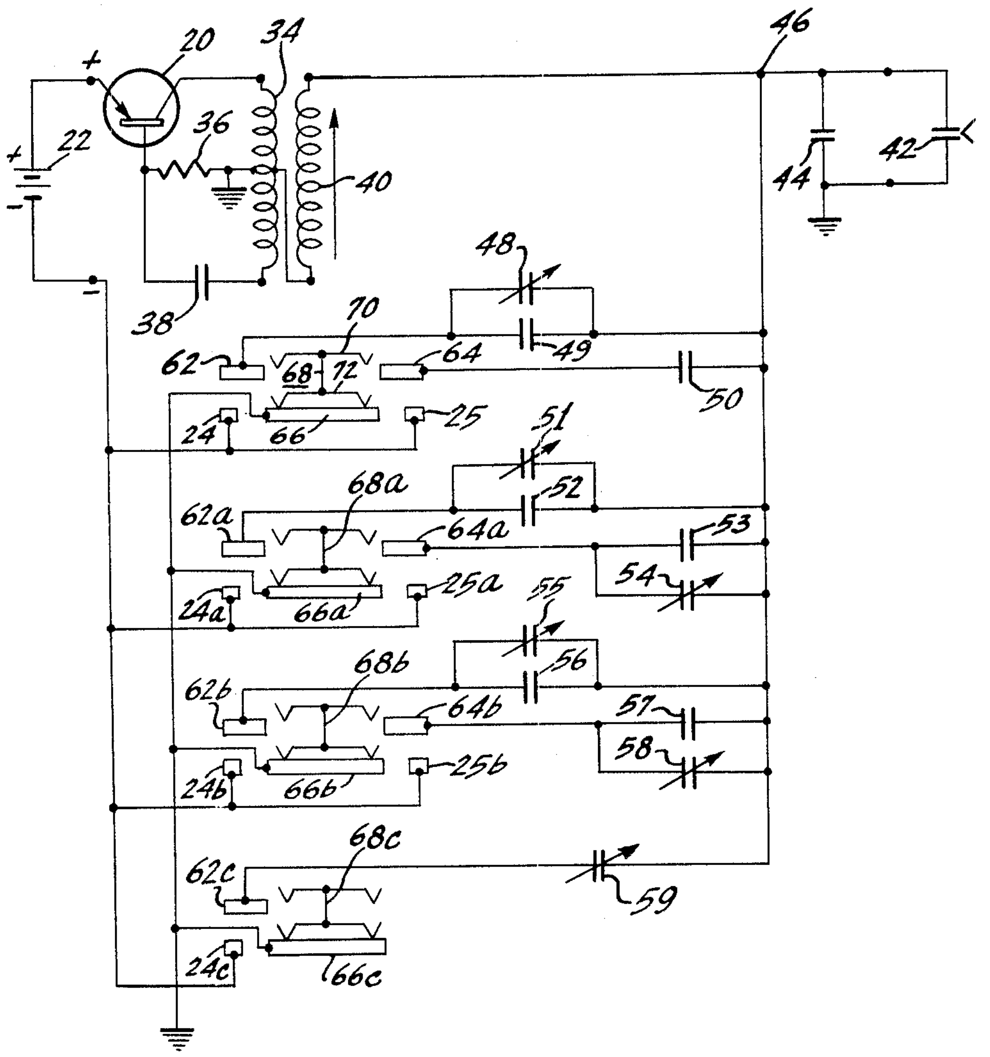

Turning first to the circuit diagram of FIGURE 13, an oscillator is shown including a transistor 20 having emitter, collector and base electrodes. The emitter electrode of the transistor 20 is connected through a source of potential 22 to a plurality of paired contacts 24, 25; 24*a*, 25*a*, and 24*b*, 25*b*, and to a further single contact 24*c*. As will be explained, the contacts 24, 25, 24*a*, 25*a*, 24*b*, and 25*b* comprise conductive portions formed on a printed circuit board 32 (FIGURES 2, 3, 4 and 10, 11, 12). The collector electrode of transmitter 20 is connected to an end terminal of a transformer coil 34. An intermediate tap of the coil 34 is connected to ground and through a resistor 36 to the base electrode of the transistor 20. The other end of the coil 34 is connected to the base electrode through a condenser 38. The intermediate tap of coil 34 is also connected through a secondary coil 40 of the transformer to a terminal 46 which is connected to ground through the parallel combination of a sonic transducer 42 and a condenser 44. The terminal 46 is also connected in parallel to one terminal of each of a plurality of condensers 48, 49, 50, 51, 52, 53, 54, 55, 56, 57, 58 and 59. Condensers 48 and 49 are connected in parallel and the other terminal of condensers 48 and 49 is connected to a contact 62 arranged near the contact 24. The other terminal of the condenser 50 is connected to a contact 64 arranged near contact 25. A further contact 66, which is arranged between contacts 24 and 25 in line therewith, is connected to ground. A conductive slider 68, comprising two arms 70 and 72, each having a contact on the end thereof, is described more fully in connection with FIGURES 9–12, and is shown diagrammatically in FIGURE 13. The slider 68 is arranged to slide in such a manner that the end of at least one of the arms 70 and 72 always makes electrical contact with the contact 66. As slider 68 is moved to the right from the central portion shown, as viewed in FIGURE 13, the slider 68, by means of the arms 70 and 72, first makes electrical connection to the contact 64, thereby including the condenser 50 in the oscillator circuit. Upon continued motion to the right, the slider 68 makes contact with the contact 25. At this time the battery 22 is connected to ground through contact 66, completing the oscillator circuit. Oscillations are produced in a known manner at a frequency determined by the circuit elements and including the condenser 50.

Upon sliding the slider 68 to its left, as viewed in FIGURE 13, from its central position, the slider 68 makes contact with the contact 62 and then with the contact 24 whereby the oscillator is energized and oscillates at the frequency determined by the condenser 49 and the trimmer condenser 48. The oscillations so produced are applied to sonic transducer 42 and transmitted to a remote controlled color television receiver and may be used to control the tint thereof.

The arrangement of, and connection to, each numbered and lettered contact is similar to the contact bearing the same number without a letter.

The connections to the contacts 24*a*, 25*a*, 24*b* and 25*b* and the operation of the slider 68*a*, 68*b* is similar for the further controls, such as that of color and volume as the connection to and operation of contacts 24, 25, 62, 64 and 66 and slider 68 as herein described for controlling tint. The condensers 51, 52, 53 and 54 connected to the contacts of color control slider 68*a* and condensers 55, 56, 57 and 58 connected to contacts for volume control slider 68*b* are of a size to produce different control frequencies as will be understood.

The contactors 24*c*, 62*c* and 66*c* which may be used for tuning or channel selection, and the slider 68*c* therefore, may be similar to the contactors and sliders described above. However, since the channel selector may be turned continuously in the same direction, only one channel control frequency is provided for the channel selector. Therefore, for channel control only contacts 24*c*, 62*c* and 66*c* are provided for first connecting condenser 59 into the oscillator circuit and then energizing the oscillator. As will be explained, only one push button is provided for the channel selector slider. Since the circuit and operation of the multifrequency oscillator is known, it need not be described further.

Figure 1:
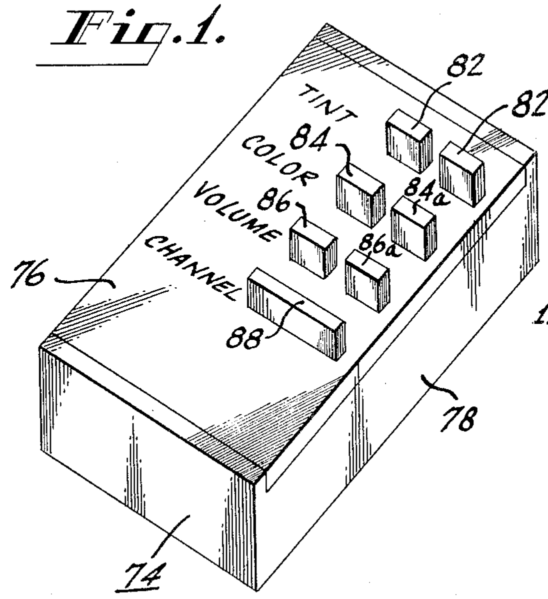
FIGURE 1 is a perspective view of a portable push-button transmitter including the push-button switches of the invention.

The box 74 shown in FIGURE 1, contains the oscillator described in connection with FIG. 13 and has a top plate 76. A circuit board 32 (FIGURES 2–4 and 10–12 but not shown in FIGURE 1) is supported within the box 74 in a suitable manner. The board 32 has the conductive pattern applied thereto or formed thereon as will be more fully described. The board 32 on which is mounted oscillator circuit elements described above, the sonic transducer 42, and the battery of FIG. 13 are mounted in the box 74 of FIG. 1. The push buttons 82, 82*a*, 84, 84*a*, 86, 86*a* and 88 which extend from the box 72 through the top plate 74 thereof, operate slides 68, 68*a*, 68*b* and 68*c* (FIGS. 2–4 and 12–14 but not shown in FIG. 1). By pushing a button down into box 74 its corresponding slide is moved in a direction perpendicular to the direction of motion of the button. The buttons 82 and 82*a*, for controlling tint, are arranged side-by-side to cause the slider 68 associated therewith, to be moved in opposite directions. Similarly, the color control buttons 84 and 84*a* are arranged side-by-side and cause motion of the slider 68*a*, while the volume control buttons 86 and 86*a* are arranged side-by-side and control motion of the slider 68*b*. The channel selection control button 88, which is arranged in line with the pairs of buttons mentioned above causes motion of its slider 68*c*.

Figure 2:
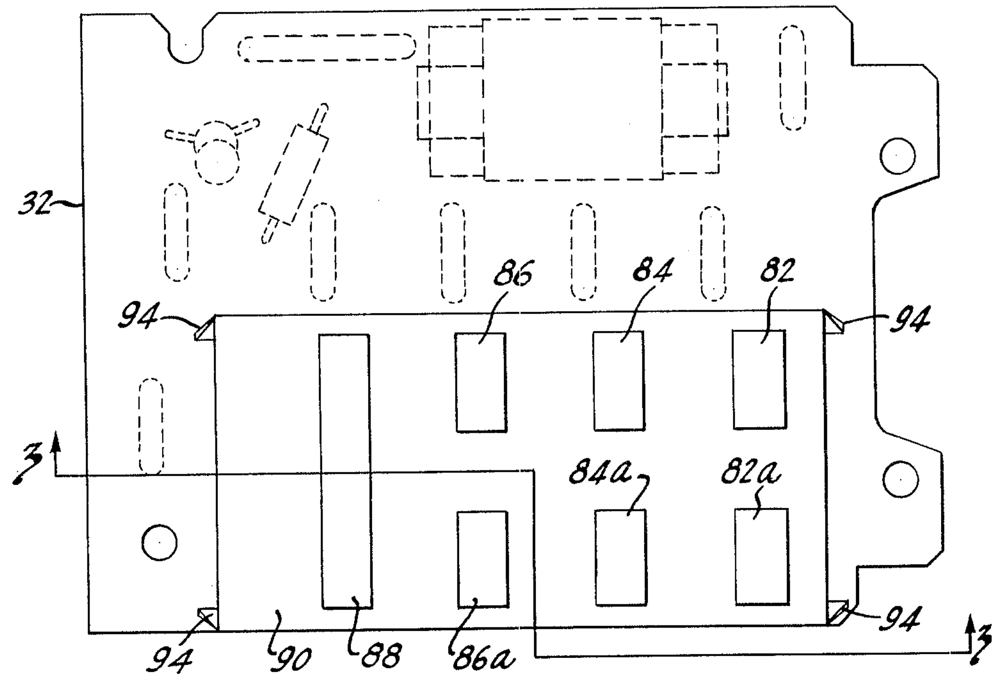
FIGURE 2 is a top view of the combined push-button switch and printed board of this invention.
Figures 3, 4:
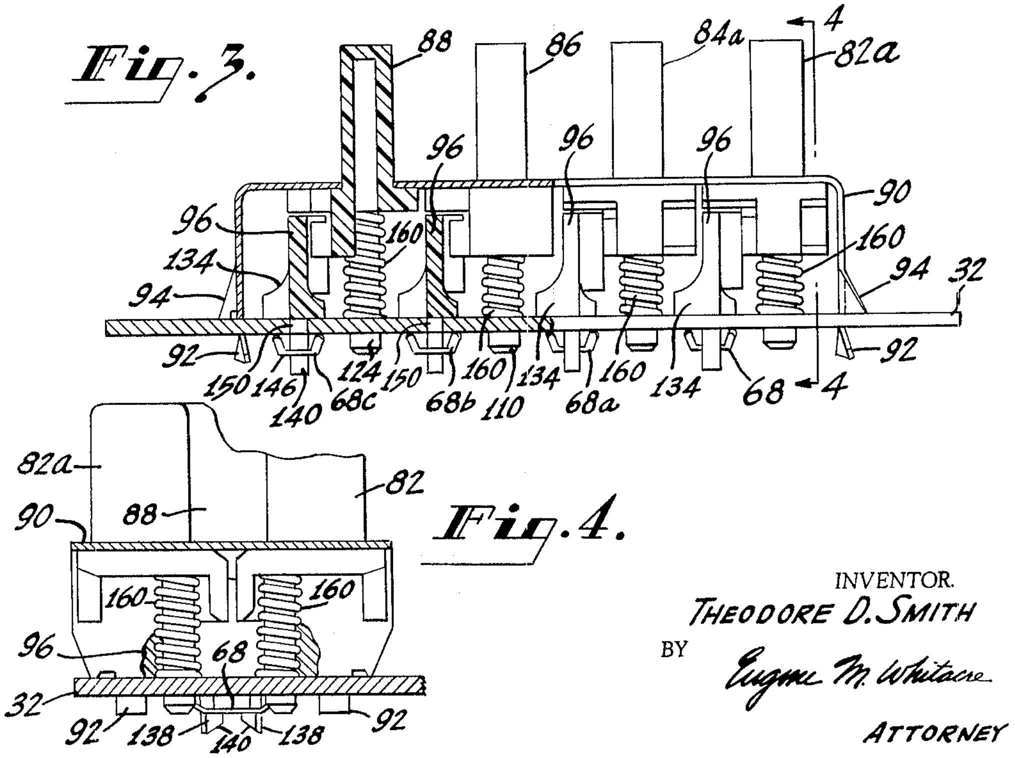
FIGURE 3 is a sectional view taken on line 3—3 of FIGURE 2.
FIGURE 4 is a sectional view taken on section line 4—4 of FIGURE 3.

The arrangement of the push button actuated operating mechanism 32 is shown in FIGURES 2, 3 and 4. In these figures, a bracket 90, which is channel shaped and which has legs 92 (FIGS. 3 and 4) extending from the ends thereof is mounted on the board 32 by inserting legs 92 into appropriately placed slots in board 32. The ends of the legs 92 below the board 32 are twisted, and the edges 94 (FIGS. 2 and 3) of the bracket adjacent and above the board 32 are bent to an offset position, whereby the bracket 90 is held firmly on the board 32. The push buttons 82, 82*a*, 84, 84*a*, 86, 86*a* and 88 are held between the bracket 90 and the upper surface of the board 32, as viewed in FIGURE 3, these push buttons extending through appropriately placed holes in the bracket 90. The push buttons 82, 82*a*, 84, 84*a*, 86, 86*a* and 88 may be moved up and down, as viewed in FIGURE 2 to thereby move insulating cam followers 96 (FIGURES 3 and 4) perpendicularly to the direction of motion of the push button, over the upper surface of the board 32. Conductive sliders 68, 68*a*, 68*b* and 68*c* (FIGURE 3) are fixed to the portions of the cam followers 96 that extend below the board 32 and these conductive sliders 68, 68*a*, 68*b* and 68*c* slide on and make contact with conductive material on the lower surface of the board 32, as shown in FIGURES 12–14.

Figure 6:
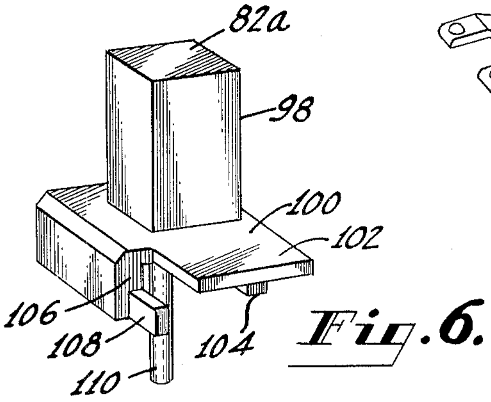

The buttons are of two types, buttons 82, 82*a*, 84, 84*a*, 86, 86*a*, which are arranged in pairs, being of one type, and a single button 88 being of another type. Each pair of buttons 82 and 82*a*, for example, consist of a right hand button 82*a* and a left hand button 82. The right hand button 82*a*, shown in FIGURE 6, may be made of one piece of plastic material having a rectangular top or push portion 98, a plate portion 100 integral with the rectangular portion 98 and extending perpendicular thereto, the plate 100 extending beyond the top portion 98 in all four directions. The front edge portion 102 (as viewed in FIGURE 6) of the rectangular plate 100 acts as a cam as will be explained. A short projection 104, extending downwardly but parallel to the top portion 98 and integral with the plate 100 at the right end of plate 100, as viewed in FIGURE 6, is provided to act as a stop to limit the travel of the push button. A downwardly extending portion 106 is fixed to plate 100 at the left or cam end thereof, as viewed in FIGURE 6. As seen in FIGURE 6, the portion 106 is narrower in back to front dimension than the back to front dimension of plate 100. The back edge of portion 106 is flush with the back edge of plate 100. The lower end 108 of downwardly extending portion 106 extends forwardly as viewed in FIGURE 6, and ends between the forward ends of cam portion 102 and downwardly extending portion 106. The upper surface of this lower end portion 108 acts as a cam, as will be explained.

A long thin cylindrical pin 110 is integrally fixed to plate 100 and extends parallel to top portion 98 and in the opposite direction from plate 100. The push button, if desired may be made hollow.

Figure 5:
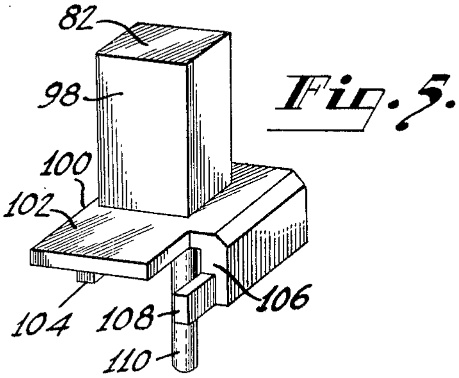
FIGURES 5 and 6 are perspective views of push-buttons used in this device.
Figure 9:
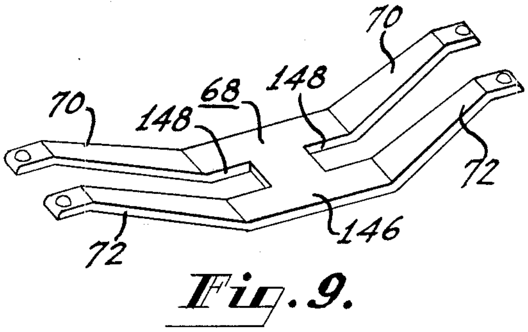
FIGURE 9 is a perspective view of a conductive slider.

The other push button 82 of the pair thereof is shown in FIGURE 5 and is similar to the just described button except that it is the left hand version thereof. Corresponding reference characters have been applied to FIGS. 5 and 6.

Figure 7:
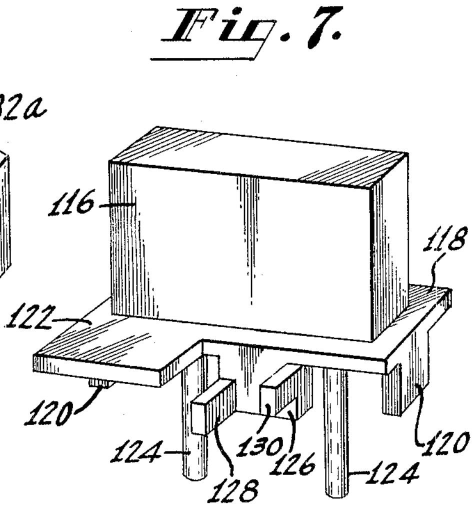
FIGURE 7 is a perspective view of a further push-button used in this device.

The button 88 which is shown in FIGURE 7 has a rectangular top, or push portion 116 which may be of the same thickness and length as rectangular portion 98 of the button 82*a*. However, the portion 116 of the button 88 is more than twice as wide as the portion 98 of the button 82*a* so as to present a pleasing appearance, as shown in FIGURE 1. A plate 118 extends perpendicular to and integral with top portion 116 and two stops 120 (only one being shown) extending parallel to top portion 116, are provided one at each end of plate 118 and extending downwardly therefrom, as viewed in FIGURE 7. A portion 122, integral with plate 118, extends forwardly as viewed in FIGURE 7. As viewed in FIGURE 7, the portion 122 extends to the right for less than half of the corresponding dimension of rectangular portion 118. The portion 122 acts as a cam, as will be explained. A pair of cylindrical guide pins 124 are provided integral with plate 118, extending from plate 118 in the opposite direction from push portion 116 and parallel to push portion 116. The front edge of plate 118, as viewed in FIGURE 7, has a downwardly extending portion 126 integral therewith and centered with respect to the long dimension of plate 118. Two portions 128 and 130 extend forwardly from portion 126 as viewed in FIGURE 7. As viewed in FIGURE 7, portion 128 extends from the left end of portion 126 and its lower edge is flush with the lower end of portion 126 and its upward extent is about three-fourths of the upward extent of portion 126. Portion 130 extends from the right end, as viewed in FIGURE 7, of portion 126 and its upward end is flush with the lower edge of plate 118, and portion 130 extends downwardly about half of the length of portion 126.

Figure 8:
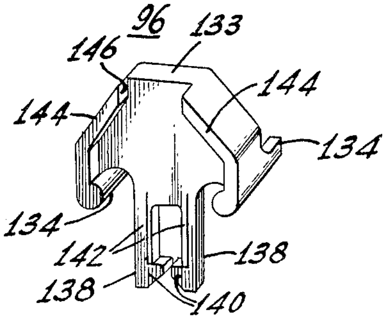
FIGURE 8 is a perspective view of an insulating cam follower used in this device.

An insulating cam follower 96 is shown in FIGURES 3, 4 and 8, 10–12. The followers 96 are all alike and they may comprise a body of plastic material having a flat top 133 and having downwardly and outwardly slanting upper surfaces symmetrically arranged with respect to the flat top 133 as shown in FIGURE 8. Feet 134 extend back and parallel to each other from the right and left edges of cam follower 96. The center portion of the follower extends downwardly, as viewed in FIGURE 8 below the feet 134. The lower center portion is bifurcated to provide the arms 138 having inwardly extending hooks 140 at the lower ends thereof. The upper surfaces of the hooks 140 are in a plane parallel to the flat top surface 133. The lower surfaces of the hooks 140 slant inwardly in an upward direction. Reinforcing ridges 142 may be provided along the arms 138. The downwardly and outerwardly slanting upper surfaces of the follower 96, opposite the feet, comprise rims 144. The rims 144 extend forwardly, as viewed in FIG. 8, of the follower 96 and cooperate with cam portions of the buttons 82, 82*a*, or 88 as will be explained. The rims 144 do not extend along the slant top 133, whereby a notch 146 is provided.

The conducting sliders 68, 68*a*, 68*b* and 68*c* are all alike. One slider 68 is shown in FIGURES 9–12. A slider 68 may be made of a sheet of beryllium copper. The slider 68 comprises legs 70 and 72 which extend away from body portion 146 of the slider 68, one leg from each of the four corners of the body portion 146. The legs 70 and 72 may slant upwardly from the body portion, as viewed in FIGURE 9. The ends of the legs 70 and 72 are bent downwards as viewed in FIGURE 9 and the material thereof may be embossed at the ends thereof to act as sliding contacts. Notches 148 are provided between each pair of legs 70 and 72 to receive arms 138 of the cam follower 96 as will be explained.

Figure 10:
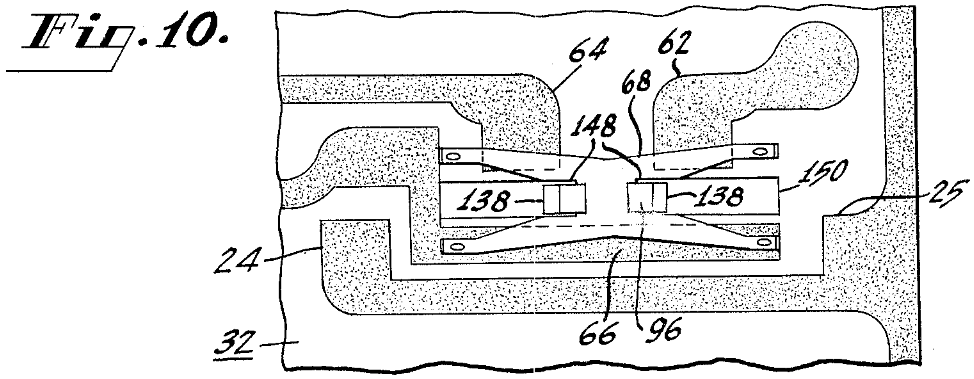
FIGURES 10–12 are fragmentary views of the several positions of a conductive slider on the printed board; and, FIGURE 13 is a circuit diagram of the transmitter enclosed in the box of FIGURE 1.
Figure 11:
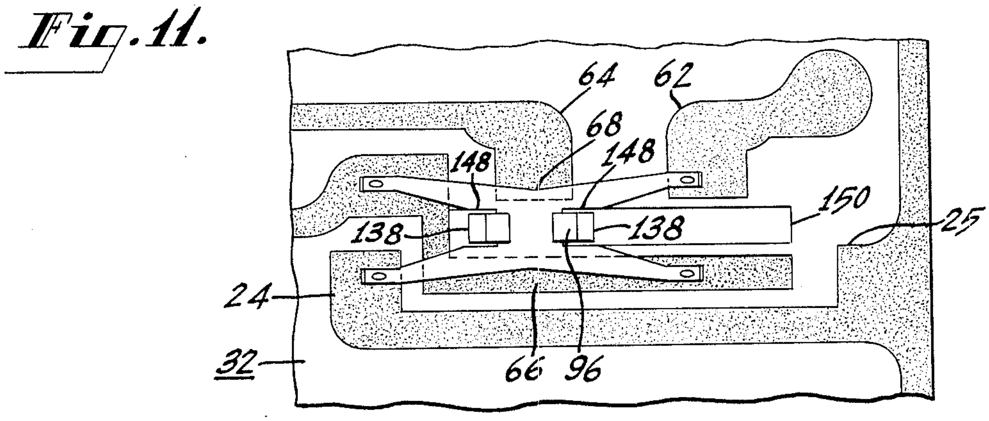

A portion of a printed board 32 that cooperates with slider 68 is shown in FIGURES 10, 11 and 12. Reference characters applied to FIGURE 13 are applied to corresponding elements in FIGURES 12–14. However, contacts 62 and 64 are reversed in position in the embodiment of FIGURES 10–12 over the positions shown in the circuit diagram of FIGURE 13. FIGURES 10 and 13 show the neutral or central position of slide 68 while FIGURES 11 and 12 show respectively the extreme left and right hand positions of slider 68 respectively assumed in response in pushing a button 82 and 82*a*. A slot 150 is provided in board 32 to guide the arms 138 of insulating follower 96. The other conductors on the board 32 may comprise any suitable patterns to effect the circuit shown in FIGURE 13.

The assembled position of push buttons, insulating slides and conductive sliders is shown in FIGURES 2–4. The switches are assembled by inserting the bifurcated legs 138 of a cam follower 96 through each slot 150 in board 32 with the feet 134 of the several followers 96 all pointing in the same direction. The conductive slider 68 (see FIG. 4) is mounted generally parallel to the board and perpendicular to and between the bifurcated legs 138 (see FIGS. 3 and 4) of the slide 96 by pushing the slider body 146 between the legs 138 until the hook ends 140 of legs 138 seat on the body portion 146 adjacent to notches 148. This holds the conductive slider 68 resiliently against the bottom surface of the board 32. A spring 160 is placed over each cylindrical pin 110 of a button 86 and the end of pin 110 is inserted in an appropriately located hole in board 32. The wide button 88 is placed in its position adjacent the channel selector slides, a spring 160 being placed over each pin 124. Then the bracket 90 is positioned over the buttons with its legs 96 in appropriate slots in board 32 and the bottom ends of the legs 96 are twisted.

The portions 128 and 130 of the wide button 88 will then extend into the gap 146 in the rim 144 of follower 96, holding the follower 96 in its central position by contact of the rim with the positions 128 and 130, and the cam member 122 will overlie the one of the slanting surfaces of the slide 96 away from the projection 130. Thereby, upon pushing the wide button 88 down, the portions 128 and 130 will clear gap 146. Then upon further pushing the button 88 down, the cam 122 will contact a slant top of the follower 96 and by cooperation of the cam 122 and the slant top, will push the follower in a direction perpendicular to the direction of motion of the button 88. The spring 160 resiliently resists the motion of the button 88 and moves the button upwards when it is released. The portion 128 will move upwards with the button 88, and portion 128 will contact the bottom of the slanting rim 144, which is above it, and in so doing will return the follower 96 to its original position. In their uppermost positions, portions 128 and 130 will contact the edges of notch 146 and will hold follower 96 in its unmoved position. The conductor slider 68*c* moves with follower 96. It is noted that the follower 96 associated with wide button 88 moves only in one direction between its original position and one extreme position.

If any of the buttons of a pair of buttons, for example, button 82 is pressed down, the follower 96 associated therewith will be moved laterally by contact of cam 102 portion of button 82 with the slanting top of follower 96 after projection 108 has cleared the gap 146. Upon release of this button 82, its spring 160 will move the button 82 up and its projection 108, by contact with the under surface of rim 144, will move the follower 96 to its center position. The projection 108 on button 82 and the projection 108 on the other button 82*a* of the pair, will fit in the notch 146 and will hold the follower 96 in its center positions until a button is pressed. If, after one button of a pair 82 or 82*a* is pushed down far enough so as to move the follower 96 to the point where it presents its flat top 133 to the cam 102 of the other button of the pair and then the other button of the pair is pushed down, no motion of the follower 96 will be caused by the other button of the pair, since no camming action will result when the cam portion of the second button presses down on the flat top 133 of the follower 96. For all buttons, cylindrical portions 110 and 124 act not only to hold the spring 160 associated therewith in place between the printed board 32 and bracket 90, but also these cylindrical portions guide their respective buttons in their travel towards and away from the board 32.

What is claimed is:

1. In combination, an insulating board having at least three contacts on one surface thereof, a conductive contactor arranged to slide rectilinearly along said surface of said board and in contact with at least one of said contacts, a push button mounted to be moved transversely of said board, and means coupling said push button to said conductive contactor so that the motion of said push button in one direction causes said contactor to slide along said board into contact first with a second and then with a third contact, and the subsequent motion of the push button in the opposite direction causes said contactor to slide along said board to break contact first with said third contact and then with said second contact.

2. In combination, an insulating board having a plurality of conductive contacts arranged on a surface of said board,
a resilient conductive slider having contact legs in contact with said surface of said board and arranged to move along said board into contact with at least one of said conductive contacts,
an insulating cam follower carrying said slider and mounted for sliding along said board,
said insulating follower having a slanting portion,
a button having a cam portion mounted for motion transversely of said board with said cam portion overlying said slanting portion, whereby, upon moving said button transversely of said board in one direction, said cam portion will contact said slanting portion and cause said follower to move along said board, and upon moving said button transversely of said board in the opposite direction, said cam portion will contact said slanted portion and cause said insulating follower to move along the board in the opposite direction.

3. In combination, an insulating board having a plurality of conductive contacts arranged on a surface of said board,
a resilient conductive slider having contact legs in contact with said surface of said board, and arranged to move along said board between a central and extreme positions and into contact with at least one of said conductive contacts,
an insulating cam follower mounted for sliding along said board,
said conductive slider being carried by said follower,
said follower having a rim portion projecting in a direction parallel to said board and perpendicular to the direction of said motion of said slider,
said rim slanting away from said board,
a button having a cam portion and a projecting portion mounted for motion transversely of said board and with said cam portion overlying said slanting rim,
said projecting portion being positioned to be in the path of said rim when said button is in one of its extreme positions, whereby upon motion of said button in one direction transversely of said board, said cam portion will contact one surface of said rim and move said follower in one direction, and upon motion of said button in its opposite direction transversely of said board, said projection will contact another surface of said rim and will move said follower in the opposite direction.

4. In combination, an insulating board having a plurality of conductive contacts arranged on a surface of said board,
a resilient conductive slider having contact legs in contact with said surface of said board, and arranged to move along said board between a central and extreme positions and into contact with at least one conductive contact,
an insulating cam follower mounted for sliding along said board, said conductive slider being carried by said cam follower,
said cam follower having a plurality of rims projecting in the same directions and parallel to said board and perpendicular to the direction of motion of said cam follower,
said rim having parallel surfaces slanting away from said board,
a pair of buttons each having a cam portion and a projecting portion, said buttons being mounted for motion transversely of said board and with a cam portion of each of said buttons overlying one of said rims,
a projecting portion of each of said buttons being positioned in the path of said rim when said follower is in one of its extreme positions, whereby upon motion of one button in one direction transversely of said board the cam portion of said button will contact one surface of said rim and move said follower in one direction and upon motion of said one button in its opposite direction transversely of said board, said projection of said one button will contact the other surfaces of said rim and will move said follower in the opposite direction, while the projection on said other button will contact an edge of said rim and prevent motion in said opposite direction beyond its central position.

5. In combination, an insulating board having a plurality of conductive contacts arranged on a surface of said board;
a resilient conductive slider having contact legs in contact with said surface of said board, and arranged to move along said board between a first and second positions and into contact with at least one of said conductive contacts;
an insulating cam follower mounted for sliding along said board carrying said conductive slider;
said follower including a cam member having a pair of opposed surfaces in a plane extending at an angle to to the plane of the surface of said board;
a frame member on said board;
a push button having a cam portion and a projecting portion;
means for mounting said push button between said frame member and said board for motion transversely of said board and with said cam portion overlying said follower cam member;
said push button including a stop portion;
resilient means coupled between said board and said push button for urging the stop portion of said push button into engagement with said frame member; and
said cam portion being positioned to engage one surface of said follower cam member when said push button is manually depressed in a direction toward said board to move said follower in one direction from said first position to said second position, said projecting portion positioned to engage the other surface of said follower cam member when said push button is released and moves away from said board in response to the bias force of said resilient means whereby said follower is moved in the opposite direction towards the first position.

6. In combination, an insulating board having a plurality of conductive contacts aranged on a surface of said board;
a resilient conductive slider having contact legs in contact with said surface of said board, and arranged to move rectilinearly along said board between first, second and third positions and into contact with at least one conductive contact;
an insulating cam follower mounted for sliding along said board, said conductive slider being carried by said cam follower;
said cam follower including a pair of cam members each having a pair of opposed surfaces in a plane extending at an angle to the plane of the surface of said board;
a frame member mounted on said board;
a pair of push buttons each having a cam portion and a projecting portion;
means for mounting said pair of push buttons between said frame member and said board for motion transversely of said board with said cam portions on said push buttons overlying different ones of said follower cam members, said each of said push buttons including a stop portion;
resilient means coupled between said board and each of said push buttons for urging the stop portions of said pair of push buttons into engagement with said frame member; and said cam portion of said first one of said pair of push buttons being positioned to engage one surface of a first one of said pair of cam members when said first push button is manually depressed in one direction towards said board, to move said follower in one direction from said first position to said second position, said projecting portion of said first push button being positioned to engage the other surface of said first cam member when said first push button is released and moves away from said board in response to the biasing force of said resilient means whereby said follower is moved in the opposite direction to return to said first position where the projection on said second one of said pair of push buttons will contact a surface of said second one of said pair of cam members to prevent motion beyond its first position, the cam portion of said second push button being positioned to engage one surface of said second cam member when said second push button is manually depressed in one direction toward said board to move said follower in a direction from said first position to said third position, said projecting portion of said second push button being positioned to engage the other surface of said second cam member when said second push button is released and moves away from said board in response to the biasing force of said resilient means whereby said follower is moved in the opposite direction to return to said first position where said projection on said first push button will contact a surface of said first cam member to prevent motion beyond its first position.

References Cited by the Examiner

UNITED STATES PATENTS

| | | | |
|---|---|---|---|
| 1,982,500 | 11/1934 | Douglas | 200—11 X |
| 2,070,717 | 2/1937 | Edwards | 200—11 |
| 2,439,338 | 4/1948 | Fuge et al. | 200—172 |
| 2,661,400 | 12/1953 | Gandelot | 200—18 X |
| 2,853,564 | 9/1958 | Gahagan | 200—11 |
| 2,853,565 | 9/1958 | Arthur et al. | 200—16 |
| 2,856,482 | 10/1958 | Spicer | 200—153 X |
| 2,896,033 | 7/1959 | Hartz | 200—11 |
| 2,914,629 | 11/1959 | D'Aprile et al. | 200—5 X |
| 2,923,787 | 2/1960 | Nelson | 200—159 X |
| 2,933,577 | 4/1960 | Wintle et al. | 200—16 X |
| 2,936,356 | 5/1960 | Napolin et al. | 200—153 |
| 2,978,555 | 4/1961 | Jones | 200—153 X |
| 2,991,343 | 7/1961 | Norden | 200—153 |
| 3,042,763 | 7/1962 | Strathearn | 200—11 X |
| 3,072,757 | 1/1963 | Gluck | 200—16 |

BERNARD A. GILHEANY, *Primary Examiner.*